(12) United States Patent
Kashiwagi et al.

(10) Patent No.: US 6,729,017 B1
(45) Date of Patent: May 4, 2004

(54) COMPONENT MOUNTER AND MOUNTING METHOD

(75) Inventors: Yasuhiro Kashiwagi, Fukuoka (JP); Kazuhide Nagao, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 741 days.

(21) Appl. No.: 09/606,834

(22) Filed: Jun. 29, 2000

(30) Foreign Application Priority Data

Jul. 2, 1999 (JP) .......................................... 11-188747

(51) Int. Cl.[7] .............................. B23P 19/00; G06F 19/00
(52) U.S. Cl. ........................... 29/740; 29/832; 700/114; 700/95
(58) Field of Search ................... 29/740, 832; 700/114, 700/95

(56) References Cited

U.S. PATENT DOCUMENTS

| 5,035,047 A | | 7/1991 | Harigane et al. ............. 29/740 |
| 5,855,059 A | * | 1/1999 | Togami et al. ................ 29/740 |
| 5,979,045 A | * | 11/1999 | Nishimori et al. ............ 29/832 |
| 6,606,790 B2 | * | 8/2003 | Hidese ........................ 29/832 |

FOREIGN PATENT DOCUMENTS

| DE | 3919636 | 6/1989 |
| EP | 0 906 011 | 3/1999 |
| EP | 0919323 | 6/1999 |
| WO | WO 98/36629 | 8/1998 |

OTHER PUBLICATIONS

German Search Report for Application 100 31 933.5 dated Mar. 20, 2003.

* cited by examiner

*Primary Examiner*—Leo Picard
*Assistant Examiner*—Sheela Rao
(74) *Attorney, Agent, or Firm*—RatnerPrestia

(57) ABSTRACT

A component mounter has two or more feeder carriages and two or more mounting heads corresponding to the feeder carriages. The mounting heads pick up components from each feeder carriage. A transfer device is able to pass components requiring transfer between the mounting heads. The transfer of components enables the mounter to be used efficiently by transferring components to a different mounting head when the operation of one of the mounting heads stops.

12 Claims, 6 Drawing Sheets

COMPONENT MOUNTER AND MOUNTING METHOD

FIELD OF THE INVENTION

The present invention relates to component mounters and mounting methods such as for mounting electronic components onto substrates.

BACKGROUND OF THE INVENTION

Component mounters for mounting electronic components such as semiconductors on substrates are equipped with a feeder carriage provided with multiple parts feeders for supplying components. A mounting head picks up components from the feeder carriage for mounting them on a substrate. If many types or numbers of components are to be mounted in the same mounting stage, two or more pairs of feeder carriages and mounting heads, without being limited to a single pair of the feeder carriage and mounting head, are disposed on the same mounting stage. These several pairs operate independently to mount components.

A recognizer captures an image of a component picked up by the mounting head while being held with a nozzle of the mounting head before mounting the component on the substrate to identify each component and detect positional deviation. In many cases, one recognizer is provided per mounting head when several mounting heads are disposed on the same mounting stage. Accordingly, if any problem occurs with one of these recognizers, the component held by the mounting head corresponding to this problematic recognizer is not recognized, and thus the mounting operation of the mounter stops.

In addition, some components require high precision recognition. Such components need to be set on a feeder carriage that will cause them to be examined by the high precision recognizer. Although several recognizers may be placed on the same mounting stage that on the same mounting stage are different types, only some of the recognizers may be high precision type. Accordingly, if the number of components requiring high precision recognition exceeds the capacity of the high precision recognizer, the components cannot be placed in regular feeder carriages even though the regular feeder carriages have space. They cannot be placed in regular feeder carriages due to the need for precision recognition.

As described above, the use of this type of conventional mounter may result in stopping the mounting operation being implemented by a combination of a feeder carriage and mounting head using a recognizer which has been stopped, even if there are several alternative feeder carriages and mounting heads. Alternatively, the capacity of the feeder carriage may not be effectively utilized due to mismatching between types of components and recognizers, causing undesired discrepancies. Consequently, the conventional mounter may not be efficiently utilized.

SUMMARY OF THE INVENTION

The present invention aims to offer a mounter and a mounting method for improving the efficiency of use of component mounters.

The component mounter of the present invention comprises the following:
  (a) more than one feeder carriage;
  (b) more than one mounting head provided corresponding to the feeder carriages for picking up components from each feeder carriage; and
  (c) transfer means for passing a component requiring transfer between the mounting heads.

The above configuration enables the improvement of the efficiency of use of the mounter by passing the component to another mounting head even when the operation of one of the mounting heads has been stopped.

The mounting method of the present invention comprises the following steps of:
  (a) picking up a component from a first mounting head;
  (b) passing the component from the first mounting head to a second mounting head; and
  (c) placing the component on the substrate using the second mounting head.

The above method enables the more efficient use of the mounter as a result of passing the component to another mounting head when the operation of one of the mounting heads has been stopped.

Another mounting method of the present invention comprises the following steps of:
  (a) picking up a component from a first feeder carriage using a first mounting head;
  (b) passing the component from the first mounting head to a second mounting head;
  (c) recognizing the component using a recognizer installed on a second feeder carriage for supplying components to the second mounting head; and
  d) placing the component on the substrate using the second mounting head after recognition.

The above method enables the use of the second recognizer to recognize the component even if the operation of the first mounting head stops or a discrepancy occurs between the type of component and the first recognizer installed on the first feeder carriage for supplying components to the first mounting head. Accordingly, the efficiency of use of the mounter may be improved.

DESCRIPTION OF THE PREFERRED EMBODIMENT

Exemplary embodiments of the present invention are described below with reference to drawings.

First Exemplary Embodiment

Figure 1:
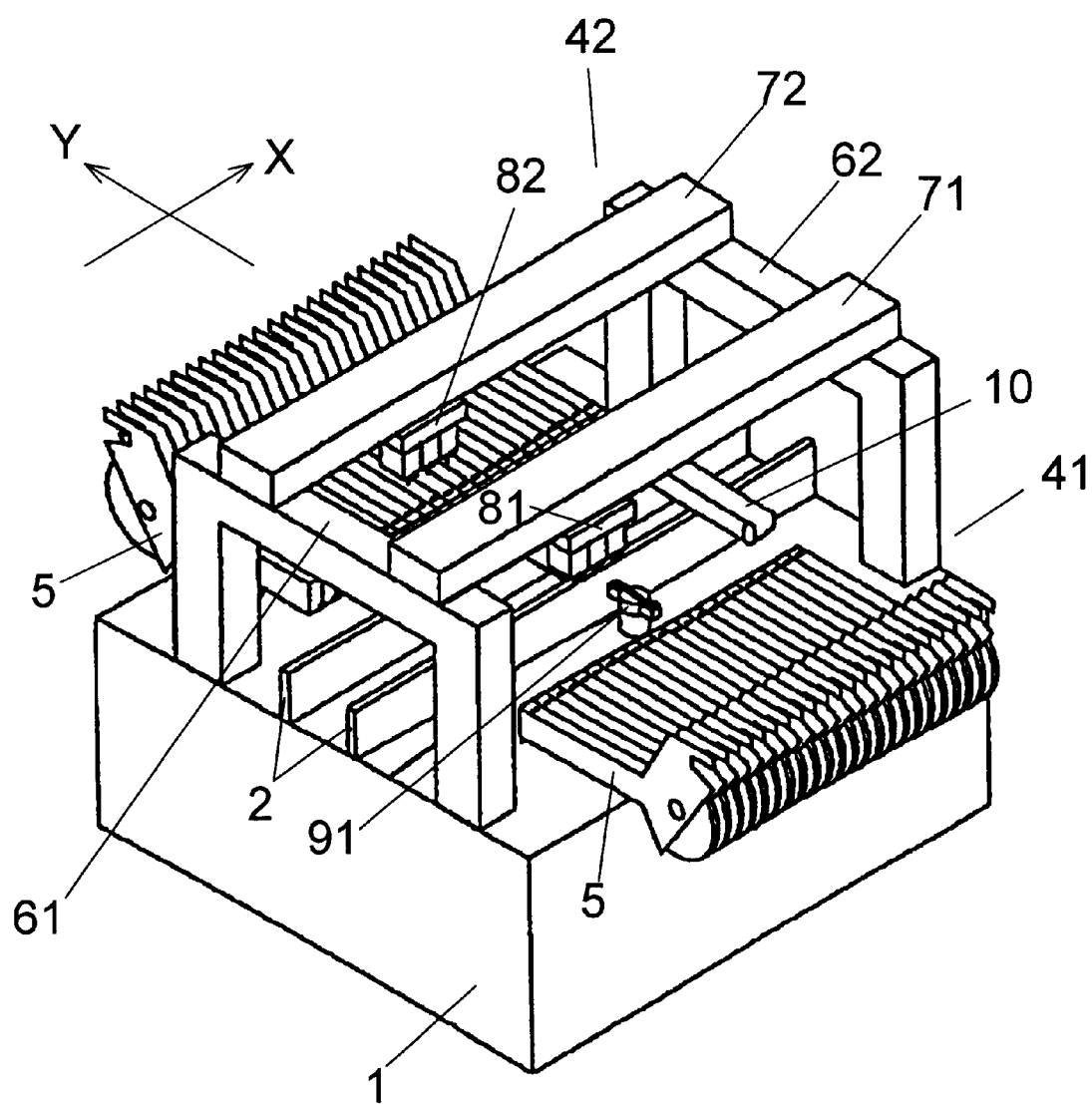
FIG. 1 is a perspective of a component mounter in accordance with a first exemplary embodiment of the present invention.
Figure 2:
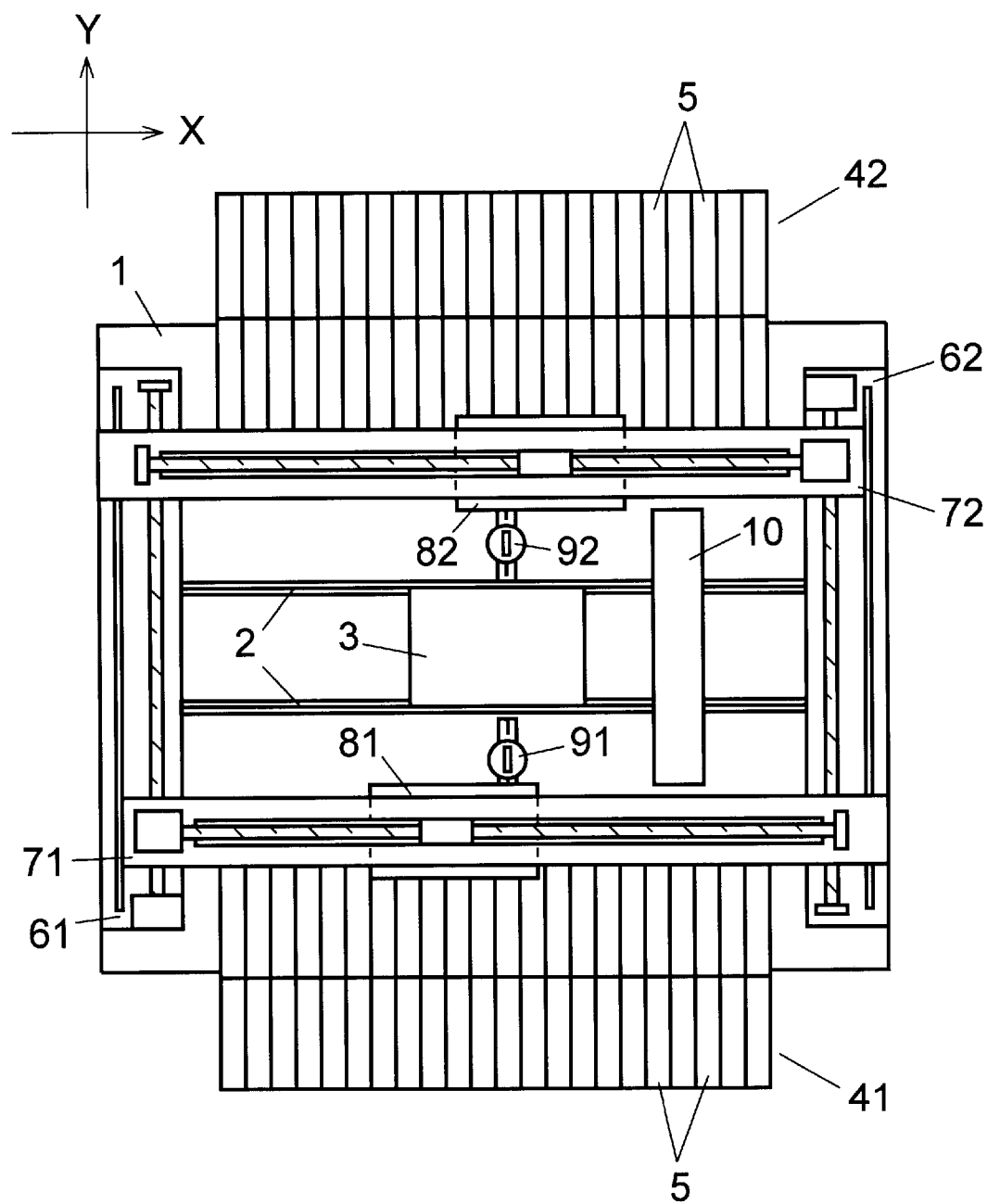
FIG. 2 is a plan view in accordance with the first exemplary embodiment of the present invention.
Figure 3:
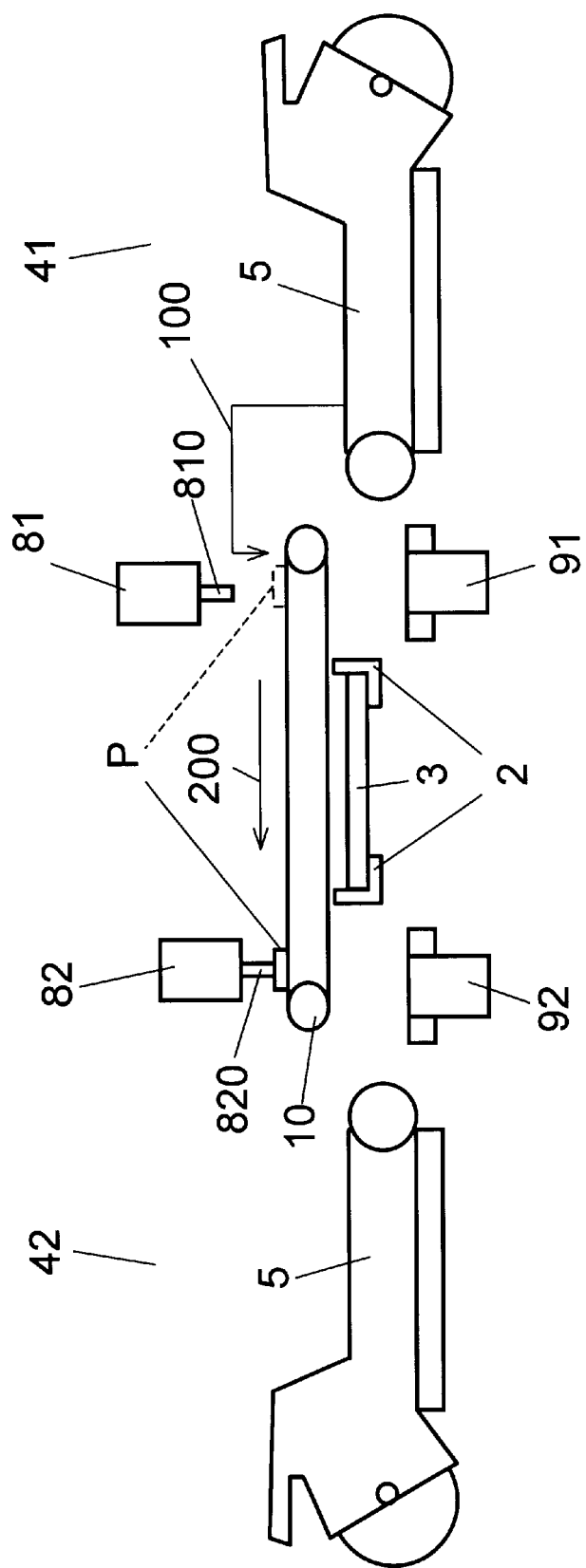
FIG. 3 is a side view in accordance with the first exemplary embodiment of the present invention.

FIG. 1 is a perspective, FIG. 2 is a plan view, and FIG. 3 is a side view of a component mounter in the first exemplary embodiment of the present invention.

First, the configuration of the mounter in the first exemplary embodiment is described with reference to FIGS. 1 and 2. A transfer rail 2 is disposed in the x-axis direction at the center of a base 1. The transfer rail 2 transports and positions a substrate 3 onto which components are to be mounted. More than one feeder carriage (a first feeder carriage 41 and second feeder carriage 42) is disposed at both sides of the transfer rail 2. Multiple tape feeders 5 are set on each of the feeder carriages 41 and 42. Each tape feeder 5 stores parts such as electronic components carried on a tape. The feeder carriages 41 and 42 supply each component by feeding the tape at a predetermined pitch.

Y-axis tables 61 and 62 are disposed on both ends of the base 1. X-axis tables 71 and 72 are then placed on the Y-axis tables 61 and 62. The x-axis table 71 moves horizontally in the Y direction by driving the Y-axis table 61. The x-axis table 72 moves horizontally in the Y direction by driving the Y-axis table 62. A mounting head 81 is attached to the x-axis table 71, and a mounting head 82 is attached to the x-axis table 72.

The head 81 moves horizontally by driving the Y-axis table 61 and x-axis table 71 in combination. Then, a nozzle 810 (see FIG. 3) picks up a component from the feeder carriage 41, and mounts it on the substrate 3. In the same way, the head 82 moves by driving the Y-axis table 62 and x-axis table 72 in combination for picking up another component from the feeder carriage 42 with a nozzle 820 (see FIG. 3), and mounts it on the substrate 3. A first recognizer 91 is disposed on the way from the feeder carriage 41 to the transfer rail 2, and a second recognizer 92 is disposed on the way from the feeder carriage 42 to the transfer rail 2. The recognizer 91 recognizes the component held by the head 81 from underneath, and in the same way, the recognizer 92 recognizes the component held by the head 82 from underneath. Each component is thus identified and any positional deviation of a component is detected. A transport conveyor 10 is disposed in the Y direction over the transfer rail 2 crossing the transfer rail 2. The conveyor 10 is disposed in a movement area of the heads 81 and 82. As shown in FIG. 3, a component P picked up by the head 81 from the feeder carriage 41 is placed on the conveyor 10 (shown by an arrow 100). The conveyor 10 is then driven to transport the component P to the other end (shown by an arrow 200). This enables the head 82 originally for the feeder carriage 42 to pick up the component P stored in the feeder carriage 41. In other words, the component P is passed from the head 81 to the head 82 by means of the conveyor 10. The above describes the case of passing a component from the head 81 to the head 82. Naturally, components may be passed the other way.

The operation of the mounter in the first exemplary embodiment as configured above is described next.

As shown in FIG. 2, the substrate 3 on the transfer rail 2 is positioned at a predetermined location. Mounting of components then starts. During mounting, the head 81 picks up components from the feeder carriage 41, and the head 82 picks up components from the feeder carriage 42. The recognizer 91 recognizes components held by the head 81, and the recognizer 92 recognizes components held by the head 82. These components are then mounted on the substrate 3.

If any abnormality in mounting operations occurs with one of the recognizers 91 and 92, the use of the faulty recognizer is stopped, and a different recognizer is used for recognition. For example, if the operation of the recognizer 91 stops, the component P picked up from the feeder carriage 41 at the side of the recognizer 91 which has been stopped is transported to the other side of the conveyor 10. Then, the head 82 on the other side picks up this component P for recognition using the recognizer 92 on the other side, and mounts it on the substrate 3. Here, the component P is a transferred component.

In some cases, the recognizer 91 and recognizer 92 may not have the same function. For example, the recognizer 91 may be used for high precision recognition, and the recognizer 92 for regular precision recognition. If the number of components requiring high precision recognition exceeds the capacity of the feeder carriage 41 at the side of the recognizer 91, some of these components requiring high precision recognition are also set on the feeder carriage 42. These components requiring high precision recognition are picked up by the head 82 from the feeder carriage 42 and then passed from the head 82 to the head 81 via the conveyor 10 for recognition by the recognizer 91.

As described above, the present invention makes it possible to maintain efficient and uninterrupted use of a mounter with two or more pairs of mounting heads and feeder carriages without closing down the feeder carriage and mounting head even if breakdown of the recognizer occurs or if a discrepancy appears between the component to be recognized and the recognizer by providing transfer means for passing components between two or more mounting heads.

Second Exemplary Embodiment

Figure 4:
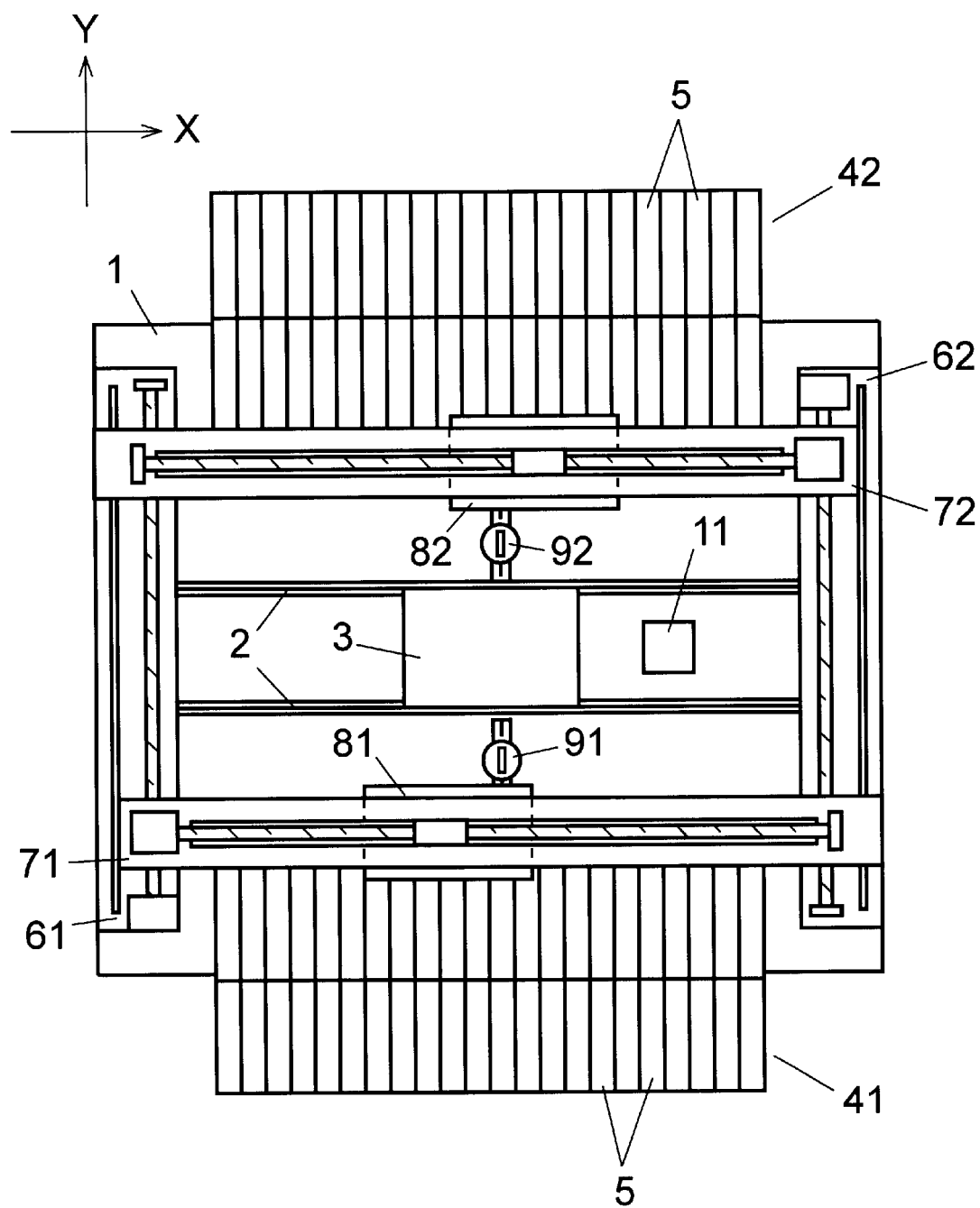
FIG. 4 is a plan view of a component mounter in accordance with a second exemplary embodiment.
Figure 5:
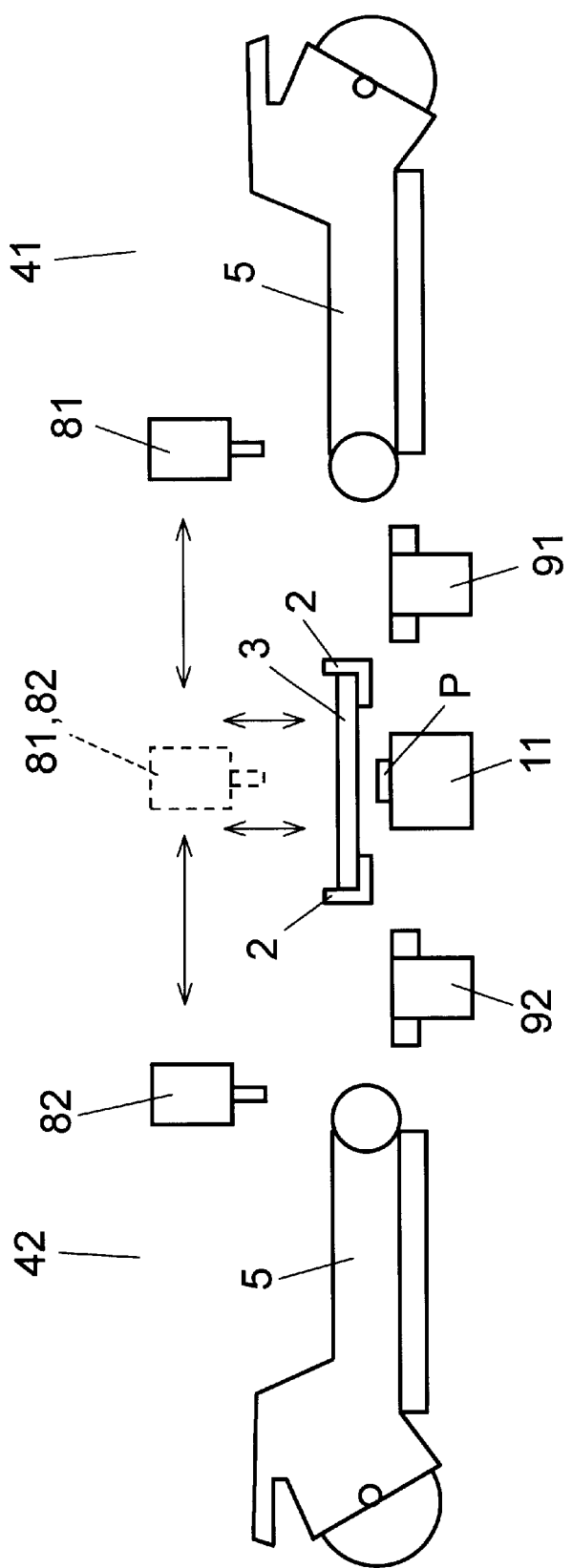
FIGS. 5 and 6 are side views in accordance with the second exemplary embodiment.
Figure 6:
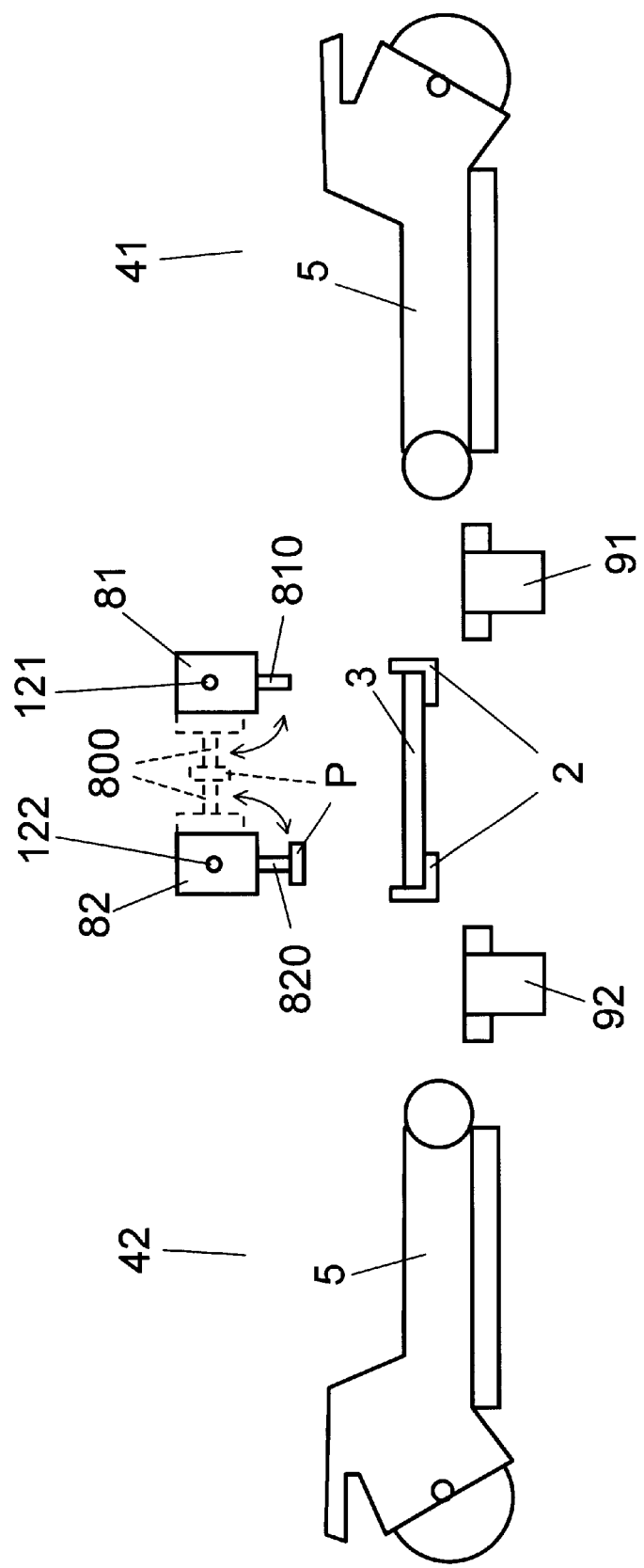

FIG. 4 is a plan view, and FIGS. 5 and 6 are side views of a component mounter in the second exemplary embodiment of the present invention. The second exemplary embodiment of the present invention describes another transfer means for passing components without using the transfer conveyor described in the first exemplary embodiment.

FIG. 4 illustrates a placement table 11 instead of the conveyor 10 on the mounter shown in FIG. 2. The table 11 is disposed within the movement area of the mounting heads 81 and 82 so that the component P picked up by the head 81 from the feeder carriage at one side, such as the first feeder carriage 41, may be placed on the table 11. This component P is then picked up by the head 82 for passing the component P from the head 81 to the head 82. Accordingly, the table 11 acts as transfer means for passing the component in the second exemplary embodiment.

FIG. 6 also shows another transfer means other than the use of a transfer conveyor. In FIG. 6, the head 81 has a rotation mechanism 121. The head 82 also has a rotation mechanism 122. As shown in FIG. 6, the heads 81 and 82 are rotatable through 90 degrees on a horizontal axis. The head 81 holding the component P may be rotated to maintain a nozzle 810 of the head 81 horizontally to face a nozzle 820 of the head 82, also rotated horizontally, so that both nozzles 810 and 820 come into proximity. Then, the head 81 stops the vacuum suction holding the component P to release the component P, and the head 82 then holds the component P by suction. This completes the passing of the component P from head 81 to head 82. In this example, heads 81 and 82 having the rotation mechanisms 121 and 122 themselves are transfer means. The use of such transfer means makes it possible to achieve the same result as described in the first exemplary embodiment.

As described above, the present invention is equipped with transfer means for passing components between two or more mounting heads. This makes it possible to increase the efficiency of use of the mounter, even if the operation of one recognizer is halted or one recognizer is not suitable for some of the components, by using another appropriate recognizer for recognizing the components.

What is claimed is:

1. A component mounter comprising:
   (a) a plurality of feeder carriages;
   (b) a plurality of mounting heads provided corresponding to said feeder carriages for picking up components from each of said feeder carriages; and
   (c) transfer means for passing a component requiring transfer, from one of said mounting heads to another of said mounting heads.

2. The mounter as described in claim 1, wherein said transfer means has a conveyor for transporting said component requiring transfer.

3. The mounter as described in claim 1, wherein said transfer means has a placement table for placing said component requiring transfer.

4. The mounter as described in claim 1, wherein said transfer means is configured with said plurality of mounting heads having a rotation mechanism.

5. The mounter as described in claim 1, wherein a recognizer for recognizing a component is disposed corresponding to each of said mounting heads on a movement route of said plurality of mounting heads.

6. The mounter as described in claim 5, wherein said recognizers include a recognizer for high precision recognition and a recognizer for regular recognition for recognizing a component.

7. A method for mounting a component comprising:
   (a) picking up the component from a feeder carriage by a first mounting head;
   (b) passing the component from said first mounting head to a second mounting head; and
   (c) placing the component on a substrate using said second mounting head.

8. The method for mounting a component as described in claim 7, wherein said step of passing the component comprising:
   placing the component on one end of a conveyor disposed crossing a transfer rail of a substrate after picking up the component with said first mounting head;
   transferring the component to the other end by driving said conveyor; and
   picking up the component by said second mounting head.

9. The method for mounting as described in claim 7, wherein said step of passing the component comprising:
   placing the component on a placement table disposed in a movement area of said first mounting head after picking up the component by said first mounting head; and
   picking up the component by said second mounting head.

10. The method for mounting as described in claim 7, wherein said step of passing the component comprising:
    rotating said first mounting head to a direction of said second mounting head after picking up the component by said first mounting head; and
    picking up the component by said second mounting head.

11. A method for mounting a component comprising:
    (a) picking up the component from a first feeder carriage by a first mounting head;
    (b) passing the component from said first mounting head to a second mounting head;
    (c) recognizing the component by a recognizer disposed corresponding to a second feeder carriage for supplying another component to said second mounting head; and
    (d) placing the component on a substrate by said second mounting head after recognition.

12. A method for mounting a component of a plurality of components comprising:
    (a) picking up each of the plurality of components with one of a plurality of mounting heads provided corresponding to a plurality of feeder carriages;
    (b) recognizing each of the plurality of components by one of a plurality of recognizers provided corresponding to said plurality of feeder carriages;
    (c) passing one of the components held by one of said mounting heads corresponding to one of said recognizers having abnormality in operation to another mounting head;
    (d) recognizing the passed component by another recognizer provided corresponding to a feeder carriage for said another mounting head; and
    (e) placing the passed component on a substrate by said another mounting head after recognition.

* * * * *